United States Patent
Smathers

(10) Patent No.: US 7,850,829 B2
(45) Date of Patent: Dec. 14, 2010

(54) SPUTTER TARGETS WITH EXPANSION GROOVES FOR REDUCED SEPARATION

(75) Inventor: David B. Smathers, Columbus, OH (US)

(73) Assignee: Tosoh SMD, Inc., Grove City, OH (US)

( * ) Notice: Subject to any disclaimer, the term of this patent is extended or adjusted under 35 U.S.C. 154(b) by 805 days.

(21) Appl. No.: 11/883,459

(22) PCT Filed: Feb. 2, 2006

(86) PCT No.: PCT/US2006/003635

§ 371 (c)(1), (2), (4) Date: Jul. 31, 2007

(87) PCT Pub. No.: WO2006/084001

PCT Pub. Date: Aug. 10, 2006

(65) Prior Publication Data

US 2009/0120784 A1    May 14, 2009

Related U.S. Application Data

(60) Provisional application No. 60/649,384, filed on Feb. 2, 2005.

(51) Int. Cl.
- *C23C 14/00* (2006.01)
- *C23C 14/32* (2006.01)
- *C25B 9/00* (2006.01)
- *C25B 11/00* (2006.01)
- *C25B 13/00* (2006.01)

(52) U.S. Cl. ............................. 204/192.12; 204/298.12

(58) Field of Classification Search ............ 204/192.12, 204/298.12
See application file for complete search history.

(56) References Cited

U.S. PATENT DOCUMENTS

| 4,299,678 A | 11/1981 | Meckel |
| 4,834,860 A | 5/1989 | Demaray et al. |
| 5,632,869 A | 5/1997 | Hurwitt et al. |
| 5,827,414 A | 10/1998 | Westwood |
| 6,071,389 A | 6/2000 | Zhang |

(Continued)

FOREIGN PATENT DOCUMENTS

DE    26 51 382 A1    5/1978

(Continued)

*Primary Examiner*—Alexa D Neckel
*Assistant Examiner*—Michael Band
(74) *Attorney, Agent, or Firm*—Wegman, Hessler & Vanderburg

(57) ABSTRACT

A magnetron sputtering target having at least one expansion groove strategically located on the target surface such that, during magnetron sputtering, contamination of the target surface due to separation and de-lamination of re-deposited sputtered particles from the target surface is reduced. The sputter target comprises a re-deposited layer having secondary cracks and a characteristic distance between cracks for supporting the inherent material stress associated with the thermal expansion of the target. The expansion groove is then positioned substantially within the characteristic distance to reduce separation and de-lamination of the re-deposited layer from the target surface.

14 Claims, 2 Drawing Sheets

U.S. PATENT DOCUMENTS

| | | |
|---|---|---|
| 6,117,281 A | 9/2000 | Novbakhtian |
| 6,464,847 B1 | 10/2002 | Kumahara et al. |
| 6,780,794 B2 | 8/2004 | Parfeniuk et al. |
| 6,797,362 B2 | 9/2004 | Parfeniuk et al. |
| 6,848,608 B2 | 2/2005 | Wickersham, Jr. |
| 2003/0052000 A1 | 3/2003 | Segal et al. |
| 2003/0183518 A1 | 10/2003 | Glocker et al. |
| 2004/0035698 A1 | 2/2004 | Ivanov et al. |
| 2004/0079634 A1 | 4/2004 | Wickersham, Jr. et al. |
| 2004/0245092 A1 | 12/2004 | Reynolds |
| 2005/0011749 A1 | 1/2005 | Kachalov et al. |
| 2005/0167015 A1 | 8/2005 | Pard et al. |

FOREIGN PATENT DOCUMENTS

| | | |
|---|---|---|
| EP | 0 297 779 A2 | 6/1988 |
| JP | 61291964 A | 12/1986 |
| JP | 11189867 A | 7/1999 |
| JP | 2002105634 A | 4/2002 |
| WO | WO 92/04482 | 3/1992 |
| WO | WO 2005/001918 A1 | 1/2005 |

SPUTTER TARGETS WITH EXPANSION GROOVES FOR REDUCED SEPARATION

CROSS-REFERENCE TO RELATED APPLICATION

This application claims the priority filing benefit of U.S. Provisional Application Ser. No. 60/649,384 filed Feb. 2, 2005.

FIELD OF THE INVENTION

The present invention relates to sputter targets for use within cathodic sputtering systems, and, more particularly, to sputter targets having expansion slots that provide reduced separation of re-deposited sputtered particles from the target surface.

BACKGROUND OF THE INVENTION

Cathodic sputtering is widely used for the deposition of thin films, or layers, of material onto desired substrates. The sputtering process employs gas ion bombardment of a target material having a face formed of a material that is to be deposited as a thin film, or layer, on the given substrate. Ion bombardment of the target material not only causes atoms or molecules of the target material to be sputtered, it imparts considerable thermal energy to the sputter target assembly, causing the target to expand and contract due to thermal expansion during operation.

Particle generation is a serious problem in magnetron plasmas, particularly in magnetron plasmas employed in the production of semiconductor devices and display technology, primarily because of the sensitivity of the final product to particle contamination, and the sensitivity of each film used in manufacturing the final product. In typical magnetron sputtering operations, film build-up on the internal surfaces of the tool is continuous. Eventually, a significant amount of film is re-deposited onto the target surface, which film tends to undergo flaking, peeling and separation from the target surface due to the inherent stress of the film and the material stress from thermal expansion and contraction of the target.

As a consequence of the peeling and separation of re-deposited sputtered particles from the target surface, contaminant particles are introduced into the sputtering plasma, greatly reducing product throughput and increasing yield loss.

It is known that de-lamination of re-deposited particles may be reduced through surface texturing. Surface texturing is often accomplished by grit blasting the target surface with abrasive material, or through application of arc-spray to achieve surface roughness values exceeding 200 microinch RMS values. One disadvantage of such texturing techniques is that they introduce foreign material into the sputter target. Since sputter surfaces are made of high purity material, introduction of foreign material into the target surface is a major contamination issue. Moreover, abrasive media is often insulating or semi-conducting and embedded media can cause charge accumulation leading to arcing behavior.

Surface texturing may also be accomplished by machining or knurling to make fine regular cuts into the target surface. One disadvantage of this approach is that the deposited layer may bridge the gaps and there is no inhomogeneity to the pattern.

Another prior approach to the sputtering particle contamination problem comprises forming grooves for trapping re-deposited sputter material along the peripheral portion of the target, as disclosed in U.S. Pat. No. 6,117,281. With this approach, a high number of electrons remain in the grooves due to the cosine component of the magnetic force, thus preventing the flow of electrons to the race track formed in the target. However, this approach does not contemplate forming thermal expansion slots proximate the center of the target surface to reduce separation of the re-deposited particles.

Japanese Patent Publication No. 61291964 A describes an approach comprising forming grooves along the entire target surface so as to absorb thermal expansion and prevent thermal deformation of a resin target. However, this approach does not specifically address the contamination problem of peeling and separation of re-deposited sputtered particles from the target surface, and there is no inhomogeneity to the pattern.

Therefore, there remains a need in the art of sputter target assemblies for a method of providing a sputter target which reduces the inherent stress from particle re-deposition in a non-homogeneous manner and without introducing foreign material to the sputter target.

SUMMARY OF THE INVENTION

The present invention provides a magnetron sputtering target having at least one expansion groove strategically located on the target surface such that, during magnetron sputtering, contamination of the target surface due to separation and de-lamination of re-deposited sputtered particles from the target surface is reduced. The present invention involves identifying a characteristic distance between secondary cracks in the re-deposited layer of the target surface. This characteristic distance tends to support the inherent material stress associated with the thermal expansion and contraction of the sputtering target. Once the characteristic distance is determined by observation of system performance, the present invention provides at least one expansion groove located substantially within the characteristic distance to reduce separation and de-lamination of the re-deposited sputtered layer.

The expansion grooves in accordance with exemplary embodiments of the present invention may be spaced periodically as a spiral, or may be knurled with a non-homogeneous pattern. In this way, no foreign material is introduced into the target surface, and the non-homogeneous groove patterns reduce the possibility that re-deposited sputter particles will bridge the gaps in the grooves and peel away from the target surface. Other advantages and benefits of the present invention will become apparent with further reference to the appended drawings, the following detailed description and the appended claims.

DETAILED DESCRIPTION OF THE INVENTION

The invention is generally directed to machining expansion joints in deposition surfaces of targets used for sputtering. Contaminated surfaces where re-deposition on targets occurs can peel up because the adhesion is poor. There is inherent stress in the re-deposited film, and thermal expansion and contraction of the target during operation increases the level of stress associated with the re-deposited film. It has been discovered that there will be some characteristic distance between the secondary cracks in the re-deposited layer of the target surface. This characteristic distance tends to support the inherent material stress associated with the thermal expansion and contraction of the sputtering target, beyond which cracking may occur and de-lamination is possible. Once the characteristic distance is determined by observation of system performance, the present invention provides at least one expansion groove located substantially within the characteristic distance to reduce separation and de-lamination of the re-deposited sputtered layer.

Accordingly, the present invention discloses a sputtering target having at least one expansion joint or groove having a spacing substantially within the characteristic distance so as to relieve the stress and reduce the separation of the re-deposited sputtered layer. The concept is to use geometrical features machined into the target surface on a larger scale than prior art methods of grit blast or arc spray. By observation of system performance, it is then possible to determine the characteristic distance by examining the flaking product to determine the distance between periodically spaced secondary cracks. Once the characteristic distance is determined, a machining method is designed to produce stress relief joints or grooves substantially within this distance. In some exemplary embodiments, it is preferred to provide the expansion grooves spaced apart at a distance substantially within the characteristic distance. However, in other embodiments, it is contemplated to produce stress relief joints or grooves with a spacing of about 50% to 200% of the characteristic distance, and still other embodiments contemplate spacings much smaller or larger than the characteristic distance. These patterns also provide a desired non-homogeneity with respect to the periodic spacing of the secondary cracks as defined by the characteristic distance.

Figure 1:
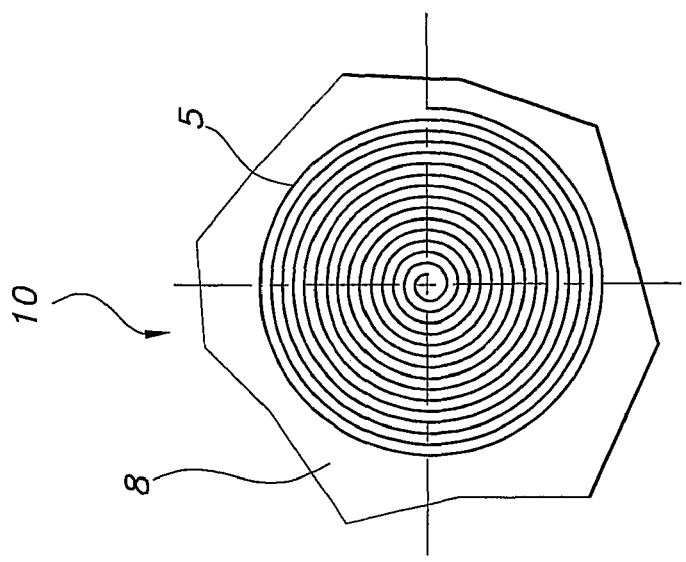
FIG. 1 is a plan view of an exemplary target surface, with a spiral groove formed therein, for use in accordance with the present invention.

Turning now to FIG. 1, there is shown an exemplary embodiment of a dome-shaped sputter target 10. Methods for making dome-shaped sputter targets 10 for use in the present invention are well-known in the art and will not be discussed further herein.

Figure 2A:
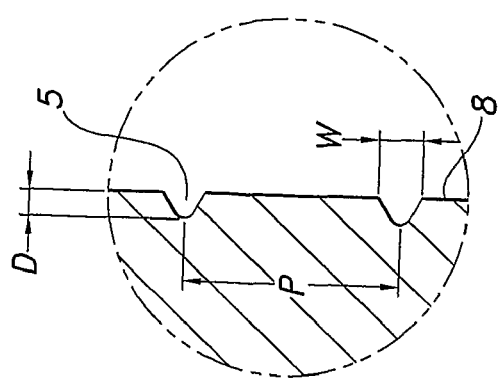
FIG. 2A is a cross-section view of an exemplary expansion groove in accordance with the present invention.

Once a suitable target 10 has been provided, at least one expansion groove 5 is formed on the target surface 8 of the target 10 as best shown in FIG. 1. An exemplary expansion groove 5 is configured into a spiral shape disposed proximate a center region of the dome-shaped target 10. As shown in FIG. 2A, the exemplary expansion groove 5 may be formed in a rounded triangular shape with a width W of about 0.025" and a depth D of about 0.016" with a radius at the bottom as shown in FIG. 2A. In this exemplary embodiment, the characteristic distance was determined to cover about a 3" radius measured from the center-line of the dome 10. The groove 5 was then designed with a pitch P of between about 0.25" to 2", with the spiral beginning at about a 4" radius from the center of the dome, and spiraling inward to about 0.5" radius from the center of the dome 5. In this way, the spacing or pitch of the spiral groove 5 is disposed substantially within the about 3" characteristic distance. Portions of the groove 5 may lie outside the characteristic distance without departing from the broader scope of the invention. It is noted, however, that the exact dimensions and pitch of the groove are not optimized, and the spiral groove design of FIGS. 1, 2A is one of many that might be chosen to achieve the desired non-homogeneity and reduction in separation. For example, other geometric patterns for forming the grooves or discontinuities may be used such as intersecting cross-like patterns, V-like patterns, etc. depending on the nature of the observed de-lamination. With the exemplary spiral groove 5, the depth D is smaller than the thickness of the observed high stress layers. It has been discovered that if the layer starts to de-bond from the target, it should crack at the groove 5 and not transfer the stress across the groove 5. If any portion does locally de-bond, it will be secured by subsequent deposition.

In order to better describe the invention, the following examples are included to demonstrate the broad applicability of the present invention. It should be appreciated by those of skill in the art that the techniques disclosed in the examples which follow represent techniques discovered by the inventors, and thus can be considered to constitute exemplary modes for its practice. However, those of skill in the art should, in light of the present disclosure, appreciate that many changes can be made in the specific embodiments which are disclosed and still obtain a like or similar result without departing from the scope of the invention.

Example 1

Cu HCM Dome Peeling

Figure 2:
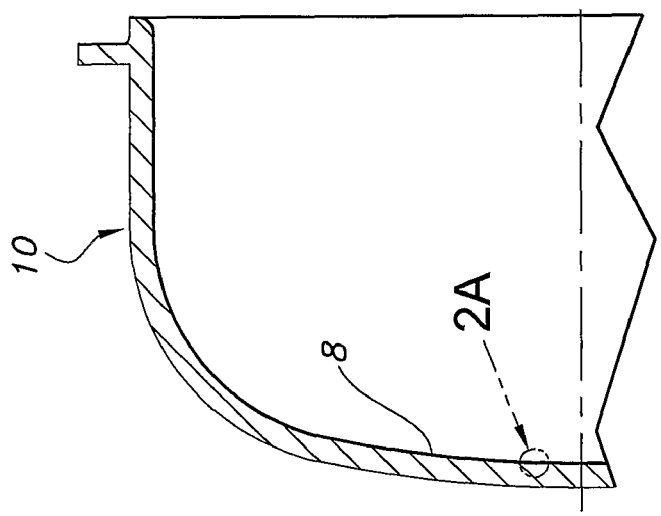
FIG. 2 is an elevated cross-section view of a dome-shaped sputter target for use in accordance with the present invention.

Referring to the dome-shaped target 10 of FIGS. 1-2, the characteristic distance was determined to be a 6" circle near the center of the dome. In this experiment, it was observed that the film cracks circumferentially at approximately the diameter of the characteristic distance and then is relieved. By observation, it could be seen that if some part of the center remains attached, even slightly, the further re-deposition will secure it to the dome.

As best shown in FIGS. 1, 2, 2A, the proposed solution was to machine a groove in a spiral pattern in the dome from about 8" diameter towards the center, stopping at about 1" diameter from the center. The pitch of the groove was designed to be between 1/16" and 2". Under these circumstances, it was shown that if any portion of the re-deposition peels up, other areas will stay attached and the subsequent deposition will secure the whole.

Example 2

Aluminum Endura Flange Peeling

Figure 4:
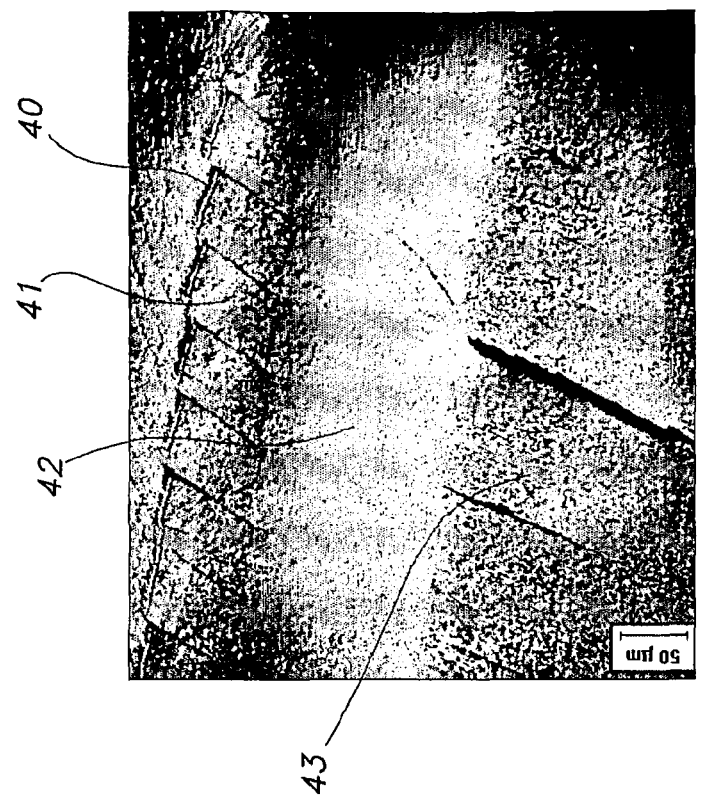
FIG. 4 is a photograph illustrating a bad target/deposition interface wherein net deposit material has peeled away from the original target surface and multi-layered deposits have become to form on the target side.
Figure 3:
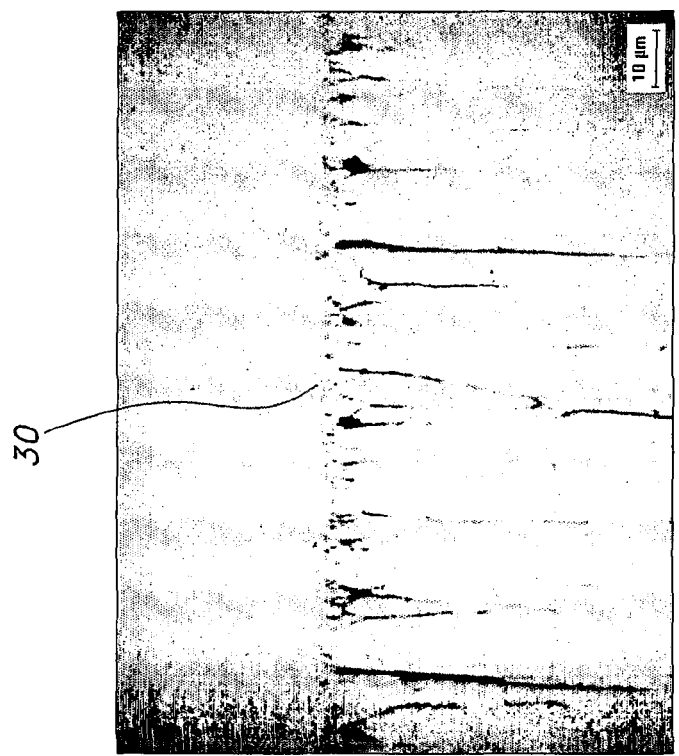
FIG. 3 is a photograph illustrating a good target/deposition interface wherein the layer grows in a columnar fashion to provide natural expansion joints.

With reference to FIGS. 3 and 4, the characteristic distance was determined to be on the order of millimeters. Under these conditions, the proposed solution was to knurl the surface with a pattern having a spacing of between about 0.5 mm and 2 mm.

As shown in FIG. 3, a good target/deposition interface 30 is formed when the layer grows in a columnar fashion that provides natural expansion joints.

As shown in FIG. 4, a "bad" target/deposition surface is formed when the net deposit material has peeled away from the original target surface and additional material has begun to form on the target side. The stress in this layer is high because it can be transferred laterally. Deposits that peel are usually multi-layered with some sort of interlayer structure that allows stress to transfer in the plane. The lateral stress overcomes the adhesion strength of the deposit to the original target surface or to one of these lateral stitching layers. Reference number 40 indicates the original interface between deposit and target. Material above this interface 40 is additional deposit formed after separation. Reference numbers 41 and 43 indicate normal columnar growth, with a dense layer 42 that stitches columnar grains together.

In view of the above examples and description, the present invention can be described as a superposition of two machining patterns, a smooth surface (e.g., RMS <16 microinch) and a deep groove spaced periodically as a spiral. One disadvantage of the prior art with a single machining pattern, just a wider pitch, is that the deposited layer may bridge the gaps and there is no inhomogeneity to the pattern. To overcome this limitation, the present invention incorporates a periodic stress concentrator, for example in the form of a spiral groove with a pitch positioned periodically but non-homogeneously within the characteristic distance such that it will cause the layer to break up over manageable distances. The layer may peel in some locations but with the stress being locally relieved, further deposition can contain the peel up and prevent it from completely separating from the target. Rather than peel across a wide area, it will only peel in small regions without losing connectivity to the rest of the deposition.

Moreover, unlike the prior art, the groove or surface discontinuity of the present invention is positioned directly on the target surface. It is known that hollow cathode magnetron targets (HCM) have shown a particular problem in the re-deposition of thick target material layers on the dome (or nadir) of the target cross section. The provision of a spiral pattern as shown in FIGS. 1, 2A has been found effective, in preliminary tests, in inhibiting the propensity of the re-deposited material from separating away from the dome surface.

While the disclosure has been illustrated and described in typical exemplary embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the scope of the disclosure as defined by the following claims.

What is claimed is:

1. A magnetron sputtering target having a target surface comprising a re-deposited layer, said layer comprising secondary cracks and a characteristic distance between said cracks, wherein said target surface further comprises at least one expansion groove disposed substantially within said characteristic distance, said at least one expansion groove being configured such that, during magnetron sputtering, contamination of the target surface due to separation of said re-deposited layer from said target surface is reduced.

2. The sputtering target as recited in claim 1, wherein said target is substantially dome shaped, and said at least one expansion groove is spiral shaped with a pitch less than or equal to said characteristic distance.

3. The sputtering target as recited in claim 2, wherein said spiral has a pitch of about 0.25" to about 2", and wherein said groove comprises a substantially rounded triangular shape having a depth of about 0.016" and a width of about 0.025".

4. The sputtering target as recited in claim 3, wherein said groove starts from an about 4" radius from the center of the dome, and spirals inward to within about 0.5" radius from the center of the dome.

5. The sputtering target as recited in claim 1, wherein said at least one groove is formed by knurling said target surface with a pattern having a spacing of about 0.5 mm to about 2 mm.

6. The sputtering target as recited in claim 1, wherein said at least one expansion groove comprises a spacing of about 50% to about 200% of said characteristic distance.

7. The sputtering target as recited in claim 1, wherein said groove is an intersecting cross-like pattern or V-like pattern.

8. A method of sputtering, comprising sputtering material from a magnetron sputtering target having a target surface comprising a re-deposited layer, said layer comprising secondary cracks and a characteristic distance between said cracks, wherein said target surface further comprises at least one expansion groove disposed substantially within said characteristic distance, said at least one expansion groove being configured such that, during magnetron sputtering, contamination of the target surface due to separation of said re-deposited layer from said target surface is reduced.

9. The method as recited in claim 8, wherein said target is substantially dome shaped, and said at least one expansion groove is spiral shaped with a pitch less than or equal to said characteristic distance.

10. The method as recited in claim 9, wherein said spiral has a pitch of about 0.25" to about 2", and wherein said groove comprises a substantially rounded triangular shape having a depth of about 0.016" and a width of about 0.025".

11. The method as recited in claim 10, wherein said groove starts from an about 4" radius from the center of the dome, and spirals inward to within about 0.5" radius from the center of the dome.

12. The method as recited in claim 8, wherein said at least one groove is formed by knurling said target surface with a pattern having a spacing of about 0.5 mm to about 2 mm.

13. The method as recited in claim 8, wherein said at least one expansion groove comprises a spacing of about 50% to about 200% of said characteristic distance.

14. The method as recited in claim 8, wherein said groove is an intersecting cross-like pattern or V-like pattern.

* * * * *